United States Patent
Lee et al.

(10) Patent No.: US 10,310,313 B2
(45) Date of Patent: Jun. 4, 2019

(54) DISPLAY DEVICE INCLUDING LIGHTING BEZEL

(71) Applicant: SAMSUNG ELECTRONICS CO., LTD., Suwon-si, Gyeonggi-do (KR)

(72) Inventors: Min Hee Lee, Seoul (KR); Eun Ah Kim, Seoul (KR); Eui Seok Kim, Seongnam-si (KR); Joon Seok Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/829,448

(22) Filed: Dec. 1, 2017

(65) Prior Publication Data
US 2018/0157095 A1    Jun. 7, 2018

(30) Foreign Application Priority Data
Dec. 2, 2016   (KR) .................. 10-2016-0163518

(51) Int. Cl.
| | | |
|---|---|---|
| *G02B 6/00* | (2006.01) | |
| *G02F 1/1333* | (2006.01) | |
| *H01J 17/49* | (2012.01) | |
| *G09G 5/10* | (2006.01) | |
| *G09G 5/02* | (2006.01) | |
| *H01L 51/52* | (2006.01) | |

(52) U.S. Cl.
CPC ......... *G02F 1/133308* (2013.01); *G02B 6/00* (2013.01); *G09G 5/02* (2013.01); *G09G 5/10* (2013.01); *H01J 17/49* (2013.01); *H01L 51/5237* (2013.01); *G02F 2001/13332* (2013.01); *G09G 2320/0646* (2013.01)

(58) Field of Classification Search
CPC ......... G02F 1/133308; G02F 1/133514; G02F 2001/13332; G09G 2320/0646; G09G 5/02; G09G 5/10; G09G 3/36; H01J 17/49; H01L 51/5237; G07F 17/3213; G02B 27/1066; G02B 6/005; G02B 6/00; H04N 5/72; G06F 1/1601
See application file for complete search history.

(56) References Cited

U.S. PATENT DOCUMENTS 8,456,104 B2    6/2013  Allard et al.
2007/0258015 A1 * 11/2007  Diederiks ............... H04N 5/72
                                                  348/739
(Continued)

FOREIGN PATENT DOCUMENTS

EP             0913626 A1 *  5/1999  ............ G02B 6/005

*Primary Examiner* — Richard J Hong
(74) *Attorney, Agent, or Firm* — Staas & Halsey LLP

(57) ABSTRACT

A display device according to an embodiment of the present disclosure includes a display including an active area on which an image is displayed and a bezel covering edges of the display so that the bezel covers a part of the active area of the display. The bezel includes a transparent part that covers the part of the active area of the display and internally transports light emitted from the covered part of the active area of the display by reflecting the light, emitted from the covered part of the active area of the display, inside the transparent part and a reflection part including a reflection surface disposed parallel to one surface of the transparent part and reflecting light transmitted from the transparent part back into the transparent part.

19 Claims, 14 Drawing Sheets

(56) References Cited

U.S. PATENT DOCUMENTS

| | | | |
|---|---|---|---|
| 2009/0009527 A1* | 1/2009 | Kuga | G02F 1/133514 |
| | | | 345/589 |
| 2010/0052548 A1 | 3/2010 | Allard et al. | |
| 2011/0018849 A1 | 1/2011 | Lowe et al. | |
| 2012/0154427 A1* | 6/2012 | Sugiyama | G09G 3/36 |
| | | | 345/593 |
| 2013/0235560 A1* | 9/2013 | Etienne | G02F 1/133308 |
| | | | 362/97.1 |
| 2014/0126075 A1* | 5/2014 | Comstock, II | G06F 1/1601 |
| | | | 359/831 |
| 2014/0177062 A1* | 6/2014 | Lee | G02B 27/1066 |
| | | | 359/629 |
| 2017/0053478 A1* | 2/2017 | Wudtke | G07F 17/3213 |

* cited by examiner

DISPLAY DEVICE INCLUDING LIGHTING BEZEL

CROSS-REFERENCE TO RELATED APPLICATION(S)

This application claims the benefit under 35 U.S.C. § 119(a) of a Korean patent application filed on Dec. 2, 2016 in the Korean Intellectual Property Office and assigned Serial number 10-2016-0163518, the entire disclosure of which is hereby incorporated by reference.

TECHNICAL FIELD

The present disclosure relates to a display device including a lighting bezel.

BACKGROUND

Display technology for displaying image information has been developed from a conventional cathode-ray tube (CRT) into flat panel display devices, such as a plasma display panel (PDP) display, a liquid crystal display (LCD), an organic light emitting diode (OLED) display, and the like. These display devices have been widely used in all industries since the display devices are advantageous in terms of power, weight, volume, and the like, compared to conventional display devices.

In general, a display device using a PDP display, an LCD, an OLED display, or the like has a bezel that covers the display on which an image is displayed. The bezel of the display device, serving as a cover for the display, may protect the display and may ensure space connected with a control circuit of the display device.

In recent years, bezels, which display no image, have evolved to be minimized or removed. Besides, optical members have been used to conceal the bezels.

SUMMARY

With an increase in the thickness of a bezel, which displays no image, the volume of a display device may increase, and a user's immersion in a screen may be disturbed. However, it is difficult to completely remove the bezel since the bezel forms the external appearance of the display device and protects a display from external shocks.

Aspects of the present disclosure are to address at least the above-mentioned problems and/or disadvantages and to provide at least the advantages described below. Accordingly, an aspect of the present disclosure is to provide a display device for lighting a bezel of the display device to use the bezel as a design element for the display device.

In accordance with an aspect of the present disclosure, a display device includes a display including an active area on which an image is displayed and a bezel covering edges of the display so that the bezel covers a part of the active area of the display. The bezel includes a transparent part covering the active area of the display and internally transporting light emitted from the covered part of the active area of the display by reflecting the light, emitted from the covered part of the active area of the display, inside the transparent part and a reflection part including a reflection surface disposed parallel to one surface of the transparent part and reflecting light transmitted from the transparent part back into the transparent part.

The display device of the present disclosure may use light emitted from the display to light the bezel, thereby using the bezel as a design element and lighting for the display device. In addition, the display device may display a status of the display device through the bezel to provide information about the status of the display device to a user.

In addition, the present disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 2 is taken along line A-A' of FIG. 1;

Throughout the drawings, it should be noted that like reference numbers are used to depict the same or similar elements, features, and structures.

DETAILED DESCRIPTION

Figure 1:
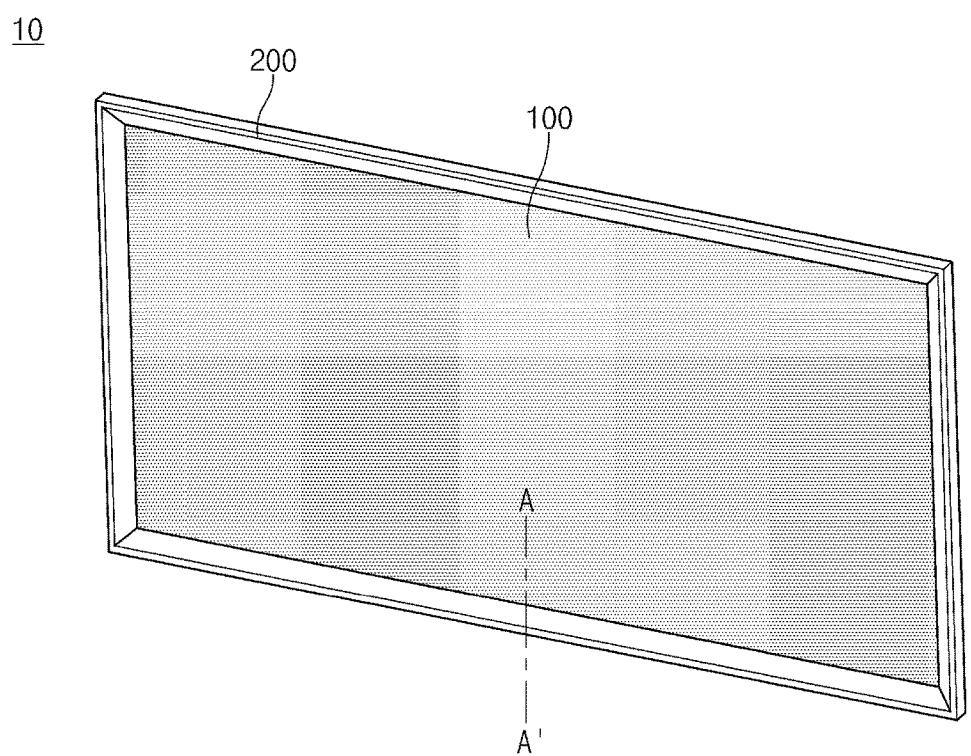
FIG. 1 illustrates a display device according to various embodiments of the present disclosure.

Hereinafter, various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar elements may be marked by similar reference numerals.

In this disclosure, the expressions "have", "may have", "include" and "comprise", or "may include" and "may comprise" used herein indicate existence of corresponding features (e.g., elements such as numeric values, functions, operations, or components) but do not exclude presence of additional features.

In this disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in this disclosure may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used in this disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in this disclosure are used to describe specified embodiments and are not intended to limit the scope of another embodiment. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of this disclosure. In some cases, even if terms are terms which are defined in this disclosure, they may not be interpreted to exclude embodiments of this disclosure.

FIG. 1 illustrates a display device according to various embodiments of the present disclosure.

Referring to FIG. 1, a display device 10 may include a display 100 and a bezel 200. The display device 10 may display, on the display 100, an image of contents reproduced in the display device 10. For example, a processor of the display device 10 may control the display 100 to display the image on the display 100. For example, the image may be an image of contents stored in a memory of the display device 10. In another example, the image may be an image of contents received from an external electronic device to the display device 10. The display device 10 may be, for example, TV, a smartphone, a tablet PC, or the like.

The display 100 may display an image (e.g., a video image). For example, the display 100 may display the image on an area of the display 100. According to an embodiment, the display 100 may emit light toward the front surface of the area on which the image is displayed. According to an embodiment, the display 100 may be any one of a liquid crystal display (LCD), a plasma display panel (PDP) display, and an organic light emitting diode (OLED) display. In the case where the display 100 is an LCD, the display 100 may include a back light unit (BLU), and the back light unit may emit light toward the front surface of the display 100. In the case where the display 100 is a PDP display, light may be emitted from a plasma gas inside the panel toward the front surface of the display 100. In the case where the display 100 is an OLED display, LED components may emit light by themselves toward the front surface of the display 100.

The bezel 200 may be a front cover for the display 100, and the display 100 may be received between the bezel 200 and a rear cover (not illustrated). According to an embodiment, the bezel 200 may be formed along the boundary of the display 100 to cover edges of the front surface of the display 100. Accordingly, the display 100 may emit light forward.

With an increase in the thickness of the bezel 200 of the display device 10, the volume of the display device 10 may increase, and a user's immersion in an image displayed on the display 100 may be disturbed. However, it is difficult to completely remove the bezel 200 since the bezel 200 forms the external appearance of the display device 10 and protects the display 100, which is received in the display device 10, from external shocks. The display device 10 of the present disclosure may light the bezel 200 by using light emitted from the display 100 to use the bezel 200 as a design element and lighting for the display device 10 and may provide information about a status of the display device 10 to the user.

Figure 2:
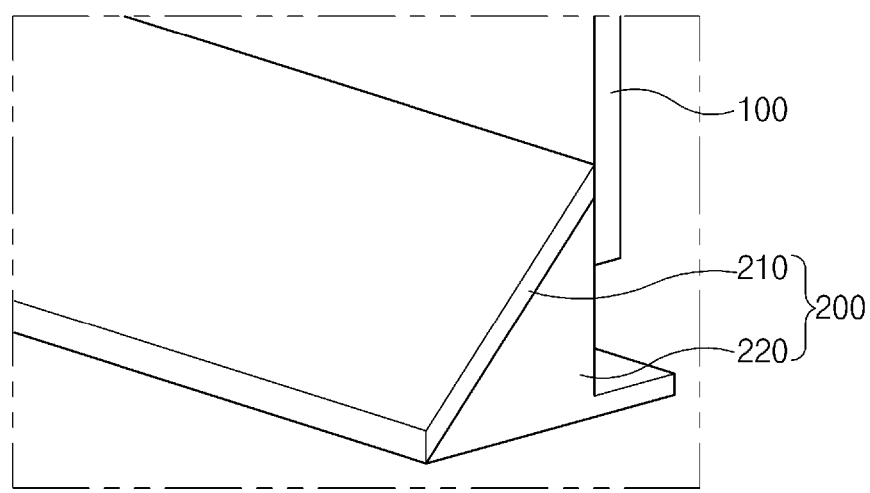
FIG. 2 is a sectional perspective view of the display device of FIG. 1, where

FIG. 2 is a sectional perspective view of the display device of FIG. 1, where FIG. 2 is taken along line A-A' of FIG. 1.

Referring to FIG. 2, the bezel 200 may cover edges of the front surface of the display 100. For example, the bezel 200 may extend from a surface surrounding side surfaces of the display 100 to the edges of the front surface of the display 100 to cover the edges of the front surface of the display 100.

According to an embodiment, the bezel 200 may include a transparent part 210 and a reflection part 220. The transparent part 210 may transport light emitted from the display 100, and the reflection part 220 may reflect light sent out (or transmitted) from the transparent part 210 back into the transparent part 210 by using a surface of the reflection part 220 on which the transparent part 210 is disposed. Accordingly, the display device 10 may light the transparent part 210 of the bezel 200 by using the light emitted from the display 100.

Figure 3:
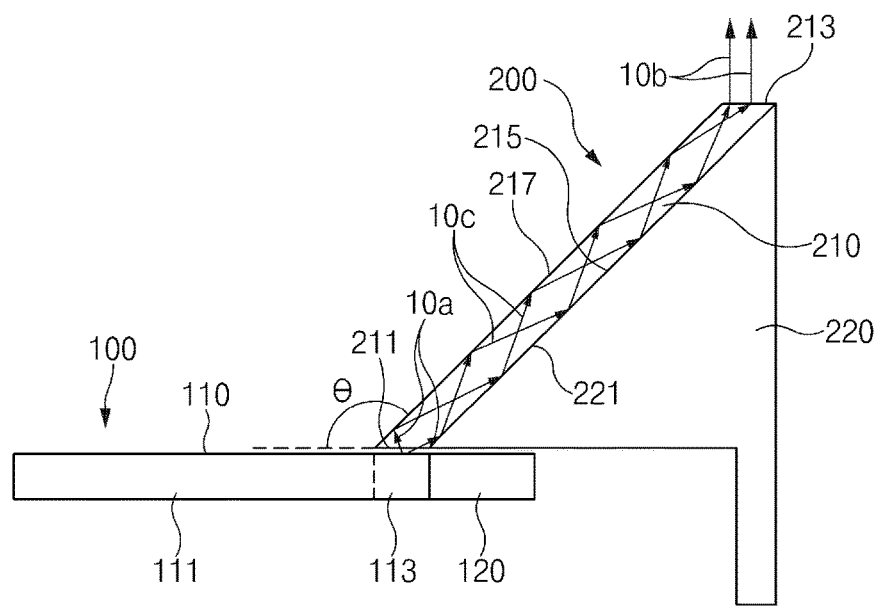
FIG. 3 illustrates a path along which light is transported to a transparent part of a bezel, according to an embodiment of the present disclosure.

FIG. 3 illustrates a path along which light is transported to a transparent part of a bezel, according to an embodiment of the present disclosure.

Referring to FIG. 3, the display 100 may include an active area 110 and a non-active area 120.

The active area 110 of the display 100 may be an area on which an image is displayed. For example, the active area 110 may be an area that includes pixels generating light. The image may include, for example, an image of contents reproduced in the display device 10 and an image for emitting light toward the bezel 200.

According to an embodiment, the active area 110 of the display 100 may include a content display area 111 and a bezel lighting area 113. The content display area 111 may be a part of the active area 110 that does not overlap the bezel 200 and may display an image of contents reproduced in the display device 10. The bezel lighting area 113 may be a part of the active area 110 that overlaps the bezel 200 and may display an image for emitting light toward the bezel 200. According to an embodiment, the display 100 may independently control the content display area 111 and the bezel lighting area 113. For example, the processor of the display device 10 may independently control pixels in the content display area 111 and pixels in the bezel lighting area 113. Accordingly, the display 100 may emit light toward the bezel 200, irrespective of whether an image is displayed on the active area 110.

According to an embodiment, the processor of the display device 10 may display the same image on the content display area 111 (or the part of the active area 110 that does not overlap the transparent part 210 of the bezel 200) and the bezel lighting area 113 (or the part of the active area 110 that overlaps the transparent part 210 of the bezel 200). For example, the processor of the display device 10 may display an image including a color selected by a user on the content display area 111 and the bezel lighting area 113. According to an embodiment, the processor of the display device 10 may display an image on the bezel lighting area 113. For example, the processor of the display device 10 may display an image including a color selected by the user on the bezel lighting area 113.

The non-active area 120 of the display 100 may be an area on which no image is displayed. For example, the non-active area 120 of the display 100 may have circuit components, interconnection wiring, and the like arranged therein for driving the active area 110 on which an image is displayed.

The bezel 200 may include the transparent part 210 and the reflection part 220. The bezel 200 may overlap (or cover) a part of the active area 110 of the display 100 to transport light emitted from the display 100.

The transparent part 210 of the bezel 200 may overlap a part of the active area 110 of the display 100 to transport light emitted from the display 100. The light input to the transparent part 210 of the bezel 200 may be reflected and refracted inside the transparent part 210 and then may be output outside the transparent part 210. For example, the transparent part 210 of the bezel 200 may be formed of any one of acrylic, polymethyl methacrylate (PMMA), polycarbonate (PC), and polyethylene terephthalate (PET), which are materials capable of transmitting light.

According to an embodiment, the transparent part 210 of the bezel 200 may include a first surface 211 facing the display 100, a second surface 213 opposite to the first surface 211, and third and fourth surfaces 215 and 217 facing different directions from the first and second surfaces 211 and 213.

According to an embodiment, the transparent part 210 of the bezel 200 may transport light incident on the first surface 211 (see reference number 10a) to the second surface 213 to output the light outside the transparent part 210 (see reference number 10b). For example, the light incident on the first surface 211 of the transparent part 210 (see reference number 10a) may be reflected by the third and fourth surfaces 215 and 217 (see reference number 10c) and may then be transported to the second surface 213. The light transported to the second surface 213 of the transparent part 210 may be refracted by the second surface 213 and may then be output outside the transparent part 210. Accordingly, the light input from the display 100 to the first surface 211 of the transparent part 210 may be output outside the transparent part 210 through the second surface 213 (see reference number 10b).

According to an embodiment, the fourth surface 217 of the transparent part 210 may be inclined at a predetermined angle (θ) with respect to the front surface of the display 100 to adjust the amount of light reflected from the fourth surface 217 of the transparent part 210 to the third surface 215 thereof. For example, light reflected by the fourth surface 217 may be totally reflected toward the third surface 215 depending on the angle (θ). In another example, part of the light reflected by the fourth surface 217 may be refracted depending on the angle (θ) and may then be output outside the transparent part 210 through the fourth surface 217. According to an embodiment, the angle (θ) may be a range in which the bezel 200 does not disturb a user's view of the content display area 111 of the display 100. For example, the predetermined angle (θ) may be greater than or equal to 90° and less than 180°.

b. The reflection part 220 of the bezel 200 may be arranged parallel to one surface of the transparent part 210 to reflect part of light sent out (or to reflect light transmitted) from the transparent part 210 back into the transparent part 210. For example, the one surface may be the third surface 215 of the transparent part 210, and the reflection part 220 may be arranged parallel to the third surface 215 of the transparent part 210 to reflect part of light sent out from the transparent part 210 back into the transparent part 210. For example, the reflection part 220 may be brought into contact with and coupled to the third surface 215 of the transparent part 210 of the bezel 200. In another example, the reflection part 220 may be coupled to the transparent part 210 of the bezel 200 with a gap between the reflection part 220 and the transparent part 210.

According to an embodiment, a surface 221 of the reflection part 220 that faces the transparent part 210 may have a high reflectivity. For example, the reflection part 220 of the bezel 200 may be injection-molded of a high-reflectivity material (e.g., a resin), and therefore the surface 221 of the reflection part 220 that faces the transparent part 210 may have a high reflectivity. In another example, the surface 221 of the reflection part 220 that faces the transparent part 210 may be coated with a high-reflectivity material or may have a reflective sheet attached thereto, which is formed of a high-reflectivity material. Accordingly, the reflection part 220 of the bezel 200 may reflect light reflected by the third surface 215 of the transparent part 210 back into the transparent part 210 regardless of the reflection angle.

According to an embodiment, the reflection part 220 of the bezel 200 may be formed to overlap the non-active area 120 of the display 100. Accordingly, light emitted from the bezel lighting area 113 of the display 100 may be input to the transparent part 210 of the bezel 200.

According to an embodiment, the bezel 200 may be injection-molded. For example, the bezel 200 may be insert-molded to include the transparent part 210 and the reflection part 220.

Accordingly, the transparent part 210 may be lighted, and thus the bezel 200 of the display device 10 may be used as a design element and lighting for the display device 10.

Figure 4:
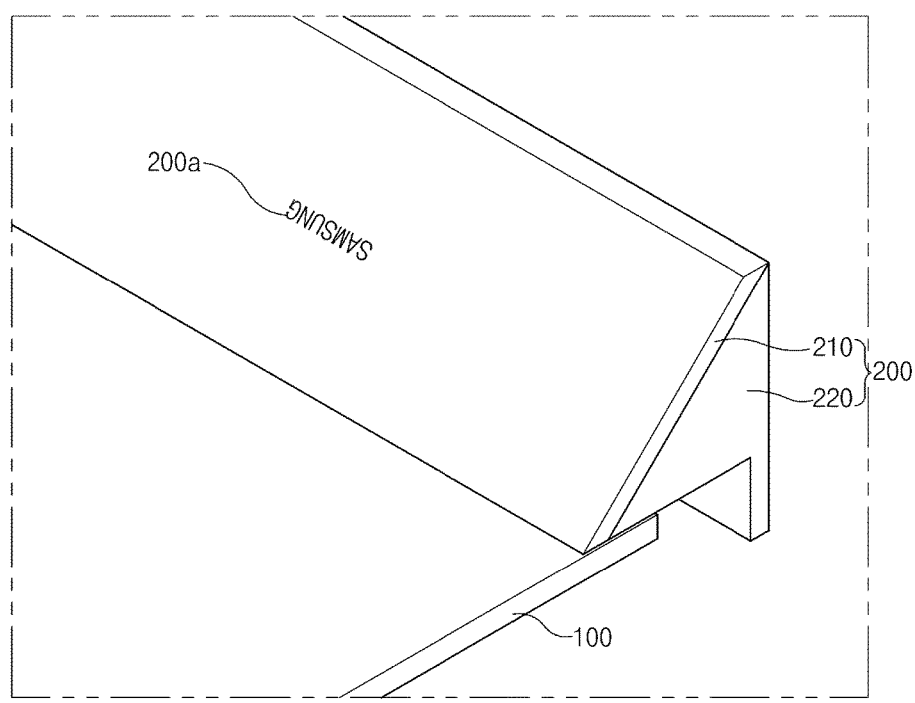
FIG. 4 illustrates a bezel having a pattern formed therein, according to an embodiment of the present disclosure.

FIG. 4 illustrates a bezel having a pattern formed therein, according to an embodiment of the present disclosure.

Referring to FIG. 4, the bezel 200 may include a pattern 200*a* for changing a path of light transported to the transparent part 210. For example, the pattern 200*a* of the bezel 200 may be formed when the bezel 200 is injection-molded. In another example, the pattern 200*a* of the bezel 200 may be imprinted on the injection-molded bezel 200 (e.g., the transparent part 210 of the bezel 200).

According to an embodiment, the pattern 200*a* of the bezel 200 may change a path of light transported to the transparent part 210 to output the light outside the transparent part 210. Accordingly, the pattern 200*a* of the bezel 200 is clearly visible from outside the display device 10.

Figure 5:
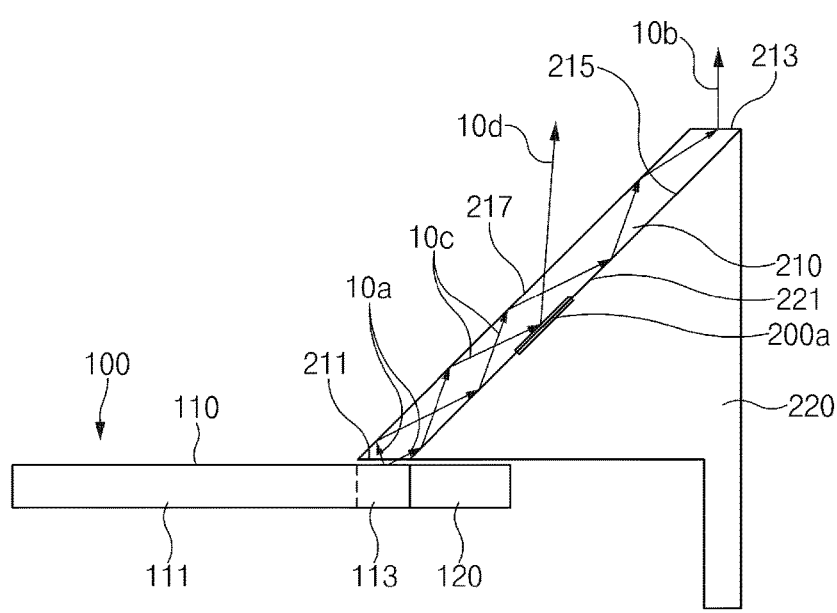
FIG. 5 illustrates a path along which light is transported inside a bezel having a pattern formed therein, according to an embodiment of the present disclosure.

FIG. 5 illustrates a path along which light is transported inside a bezel having a pattern formed therein, according to an embodiment of the present disclosure.

Referring to FIG. 5, the pattern 200*a* of the bezel 200 may be included in at least one of the transparent part 210 and the reflection part 220. The pattern 200*a* of the bezel 200 may be formed on the surface 221 where the transparent part 210 and the reflection part 220 face each other. For example, the pattern 200*a* may be formed on at least one of the third surface 215 of the transparent part 210 and the surface 221 that faces the third surface 215.

According to an embodiment, the pattern 200*a* of the bezel 200 may be embossed or engraved on at least one of the transparent part 210 and the reflection part 220. For example, the pattern 200*a* of the bezel 200 may be engraved on any one of the transparent part 210 and the reflection part 220. In another example, the pattern 200*a* of the bezel 200 may be engraved on the transparent part 210 and may be embossed or engraved on the reflection part 220. In another example, the pattern 200*a* of the bezel 200 may be engraved on the reflection part 220 and may be embossed or engraved on the transparent part 210.

According to an embodiment, the pattern 200*a* of the bezel 200 may change a path of light transported to the transparent part 210 to output the light outside the transparent part 210. The pattern 200*a* of the bezel 200 may change a path of light transported to the transparent part 210 to output the light outside the transparent part 210 from the position of the pattern 200*a* through a surface opposite to the one surface of the transparent part 210 that is arranged parallel to the reflection part 220. For example, the pattern 200*a* of the bezel 200 may transport the light from the position where the pattern 200*a* is formed on the third surface 215 of the transparent part 210 to the fourth surface 217 of the transparent part 210.

According to an embodiment, in the case where the bezel 200 has the pattern 200*a* formed therein, light input to the first surface 211 of the transparent part 210 (see reference number 10*a*) may be output outside the transparent part 210 through the second surface 213 and the fourth surface 217 (see reference numbers 10*b* and 10*d*). For example, the light input to the first surface 211 of the transparent part 210 (see reference number 10*a*) may be reflected by the third and fourth surfaces 215 and 217 (see reference number 10*c*) and may then be transported to the second surface 213. Light reflected by the pattern 200*a* formed in the bezel 200 may be output outside the transparent part 210 through the fourth surface 217 (see reference number 10*d*). Accordingly, the light input from the display 100 to the first surface 211 of the transparent part 210 may be output outside the transparent part 210 through the second surface 213 and the fourth surface 217 of the transparent part 210 (see reference numbers 10*b* and 10*d*).

As a result, the pattern 200*a* may be lighted, and thus the bezel 200 of the display device 10 may be used as a design element for the display device 10.

Figure 6:
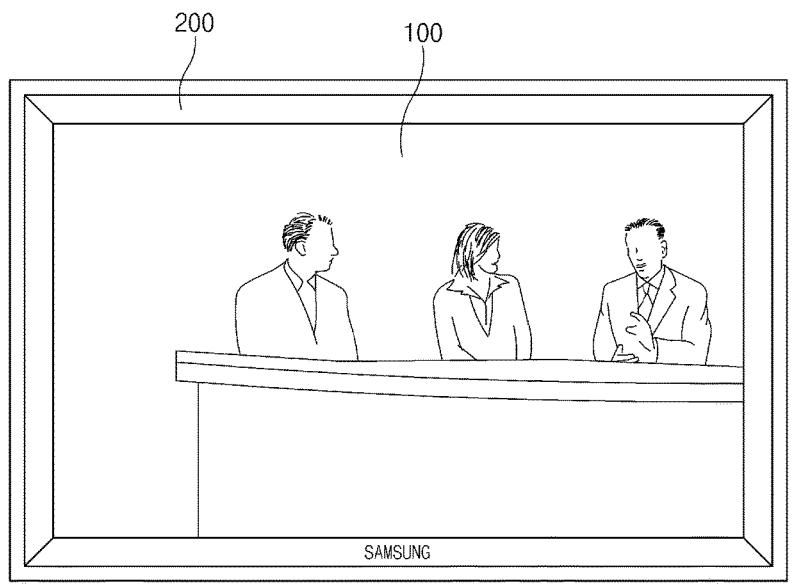
FIG. 6 illustrates a display device that displays an image of contents on a display thereof, according to an embodiment of the present disclosure.

FIG. 6 illustrates a display device that displays an image of contents on a display thereof, according to an embodiment of the present disclosure.

Referring to FIG. 6, the display device 10 may display an image of contents on the display 100. For example, the display device 10 may display the image of contents on the content display area 111 of the display 100.

Figure 7A:
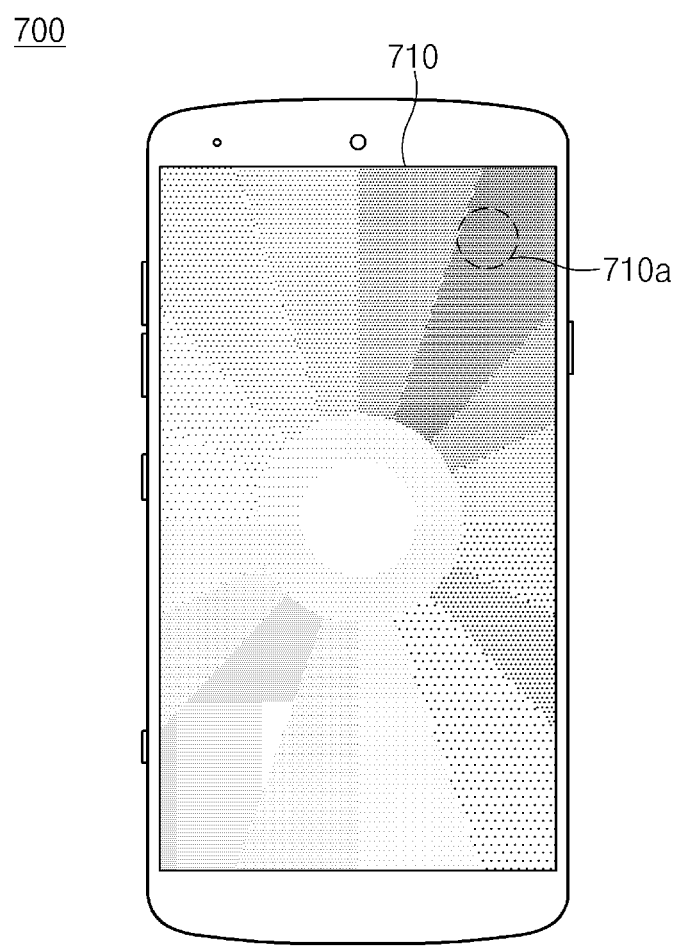
FIGS. 7A to 7C illustrate a process in which a display device displays an image in conjunction with an application of an electronic device, according to an embodiment of the present disclosure.
Figure 7B:
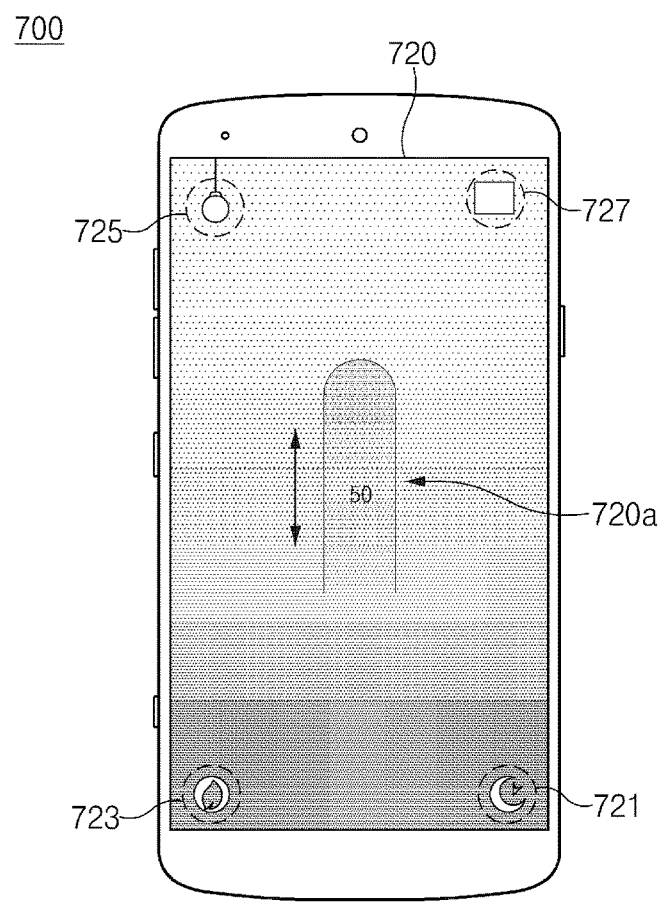
Figure 7C:
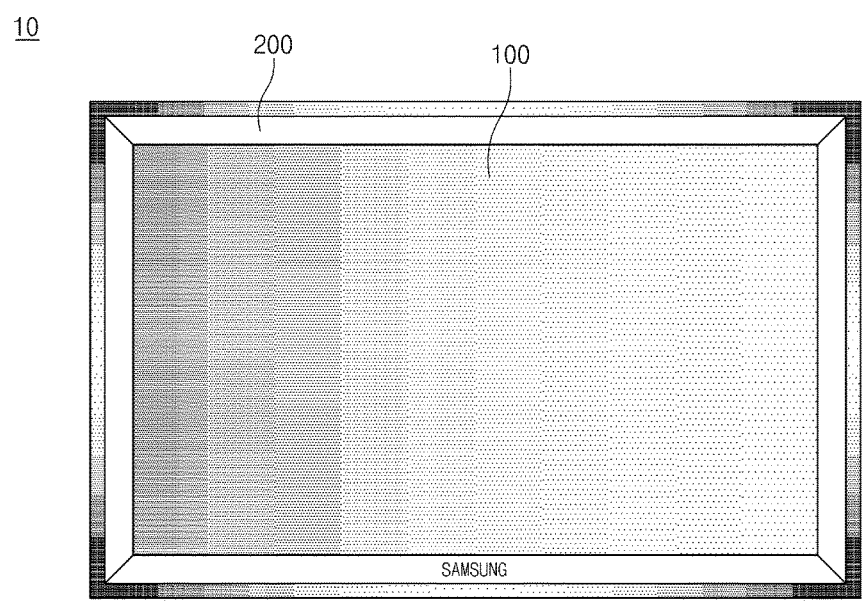

FIGS. 7A to 7C illustrate a process in which a display device displays an image in conjunction with an application of an electronic device, according to an embodiment of the present disclosure.

Referring to FIGS. 7A and 7B, the display device 10 may operate in conjunction with an application of an electronic device 700 to display an image on the display 100. The electronic device 700 may be a device, such as a smartphone, a tablet PC, or the like, which receives a user input through a user input module (e.g., a touch panel).

According to an embodiment, the electronic device 700 may receive, from a user, an input for selecting an image to be displayed on the display device 10. For example, when the application is executed, the electronic device 700 may display, on a display thereof, a color selection screen 710 for selecting a color of the image to be displayed on the display device 10. The user may select a color of the image to be displayed on the display device 10 through the color selection screen 710 (see reference number 710*a*).

According to an embodiment, the electronic device 700 may display the selected color on the display thereof. For example, the electronic device 700 may display, on the display thereof, an image including the color selected by the user as a background of a color display screen 720. According to an embodiment, the electronic device 700 may receive, from the user, an input for controlling the image displayed on the display device 10. For example, the electronic device 700 may receive, from the user, an input 720*a* for controlling the brightness of the image displayed on the display device 10. The input 720*a* for controlling the brightness of the image may be, for example, the user's drag in a vertical direction.

According to an embodiment, the electronic device 700 may receive, from the user, an input for selecting a plurality of functions for displaying the image including the selected color on the display device 10. The plurality of functions may include, for example, a timer function, a sound function, a content reproduction function, and a bezel lighting function. According to an embodiment, the color display screen 720 of the electronic device 700 may include a plurality of icons for selecting the plurality of functions. For example, the color display screen 720 of the electronic device 700 may include a timer icon 721, a sound icon 723, a content reproduction icon 725, and a bezel lighting icon 727.

Referring to FIG. 7C, the display device 10 may receive information about the selected image from the electronic device 700 and may display the selected image on the display 100 based on the received information about the image. For example, the display device 10 may display the image including the selected color on the content display area 111 of the display 100 (or the part of the active area 110 that does not overlap the transparent part 210 of the bezel 200) and the bezel lighting area 113 (or the part of the active area 110 that overlaps the transparent part 210 of the bezel 200). Accordingly, the display device 10 may display the selected color on the display 100 and may light the bezel 200 (or the transparent part 210 of the bezel 200) with the selected color.

Figure 8:
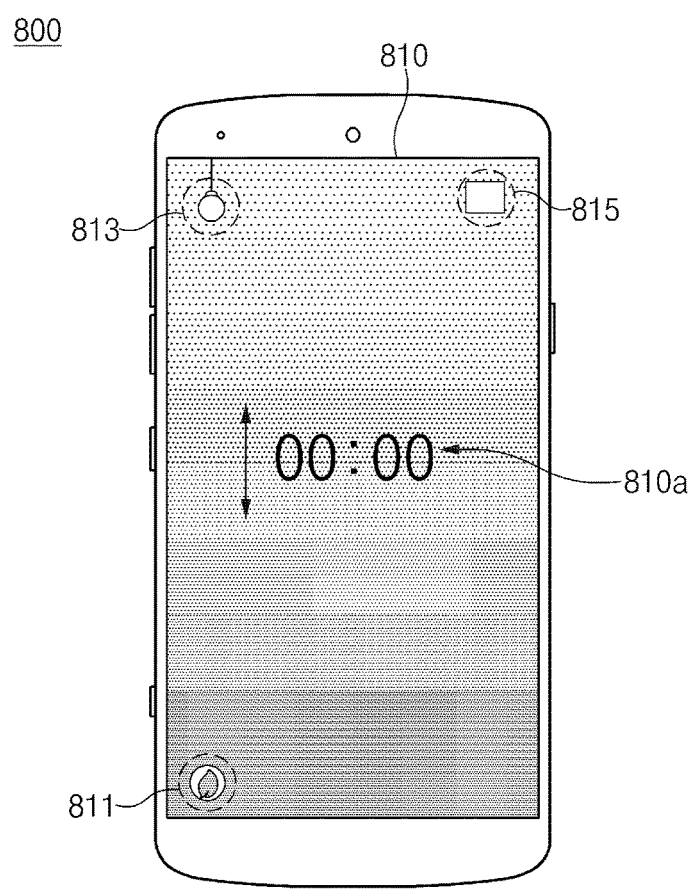
FIG. 8 illustrates a timer function of an electronic device operating in conjunction with a display device, according to an embodiment of the present disclosure.

FIG. 8 illustrates a timer function of an electronic device operating in conjunction with a display device, according to an embodiment of the present disclosure.

Referring to FIG. 8, an electronic device 800 may receive, from a user, an input (e.g., a touch on the timer icon 721 of FIG. 7B) for selecting a timer function and may execute the timer function.

According to an embodiment, when the timer function is executed, the electronic device 800 may receive, from the user, an input of a period of time during which a selected image is to be displayed on the display device 10. For example, when the timer function is executed, the electronic device 800 may display, on a display thereof, a time input screen 810 for inputting a period of time. The user may input, through the time input screen 810, a period of time during which an image including a selected color is to be displayed on the display device 10 (see reference number 810*a*). The input of the time period (see reference number 810*a*) may be, for example, a drag in a vertical direction.

According to an embodiment, the electronic device 800 may include icons for selecting a plurality of functions. For example, the electronic device 800 may include a sound icon 811, a content reproduction icon 813, and a bezel lighting icon 815 through which to select different functions.

According to an embodiment, the display device 10 may receive information about the input time period and may display the selected image on the display 100 for the input time period. If the input time period elapses, the display device 10 may display an image of contents on the display 100.

Figure 9:
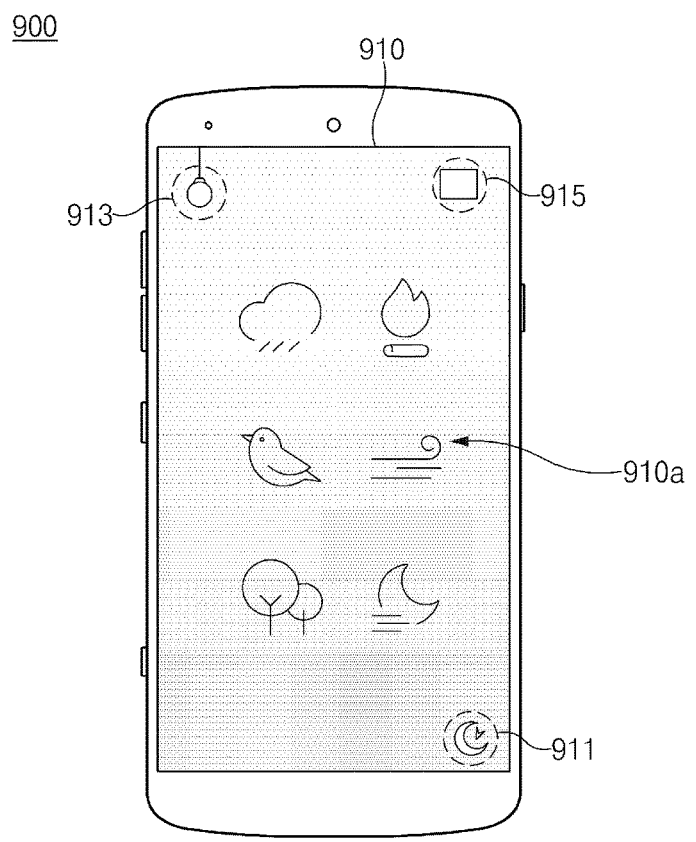
FIG. 9 illustrates a sound function of an electronic device operating in conjunction with a display device, according to an embodiment of the present disclosure.

FIG. 9 illustrates a sound function of an electronic device operating in conjunction with a display device, according to an embodiment of the present disclosure.

Referring to FIG. 9, an electronic device 900 may receive, from a user, an input (e.g., a touch on the sound icon 723 of FIG. 7B) for selecting a sound function and may execute the sound function.

According to an embodiment, when the sound function is executed, the electronic device 900 may receive, from the user, an input for selecting sound that the display device 10 is to output while displaying a selected image. For example, when the sound function is executed, the electronic device 900 may display, on a display thereof, a sound selection screen 910 for selecting sound (e.g., sound of the wind, sound of a bird, or sound of waves). The user may select, through the sound selection screen 910, sound to be output by the display device 10 (see reference number 910*a*). The input for selecting sound (see reference number 910*a*) may be, for example, the user's touch on a sound icon.

According to an embodiment, the electronic device 900 may include icons for selecting a plurality of functions. For example, the electronic device 900 may include a timer icon 911, a content reproduction icon 913, and a bezel lighting icon 915 through which to select different functions.

According to an embodiment, the display device 10 may receive information about the selected sound and may output the selected sound when displaying the selected image on the display 100. According to an embodiment, the display device 10 may modify the selected image on the basis of the selected sound. For example, in the case where the display device 10 outputs sound of waves, the display device 10 may modify the selected image in a wave form.

Figure 10:
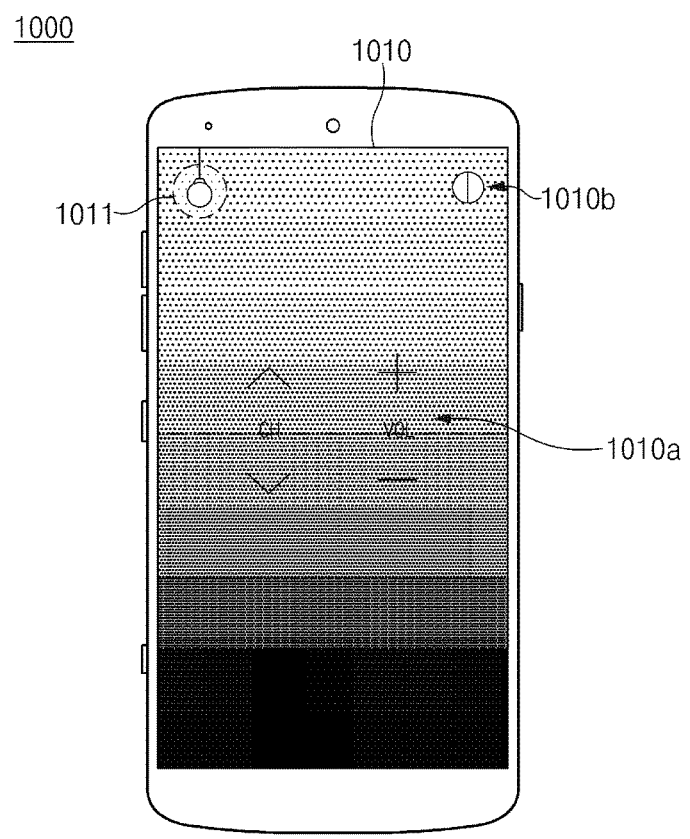
FIG. 10 illustrates a content reproduction function of an electronic device operating in conjunction with a display device, according to an embodiment of the present disclosure.

FIG. 10 illustrates a content reproduction function of an electronic device operating in conjunction with a display device, according to an embodiment of the present disclosure.

Referring to FIG. 10, an electronic device 1000 may receive an input (e.g., a touch on the content reproduction icon 725 of FIG. 7B) for selecting a content reproduction function and may execute the content reproduction function.

According to an embodiment, the electronic device 1000 may receive, from a user, an instruction for displaying an image of contents on the display device 10. For example, when the content reproduction function is executed, the electronic device 1000 may display, on a display thereof, a control screen 1010 for controlling the display device 10. The user may control the channel, volume, and power of the display device 10 through the control screen 1010 (see reference numbers 1010*a* and 1010*b*). Inputs for the control (see reference numbers 1010*a* and 1010*b*) may be, for example, a touch on a virtual input button (e.g., a channel button, a volume button, or a power button). According to an embodiment, the electronic device 1000 may display a color selected by the user prior to the execution of the content reproduction function as a background of the control screen 1010.

According to an embodiment, the electronic device 1000 may include icons for selecting a plurality of functions. For example, the electronic device 1000 may include a color display icon 1011. The color display icon 1011 may be used to execute a color display function. The color display function may be a function of displaying an image including the color selected by the user on the display device 10. The image including the selected color may be, for example, an image including the color selected by the user prior to the execution of the content reproduction function. The image including the selected color may be displayed on the display of the electronic device 1000 as a background of the control screen 1010.

According to an embodiment, if the display device 10 receives, from the electronic device 1000, an instruction for displaying an image of contents, the display device 10 may display the image of contents on the display 100. According to an embodiment, the display device 10 may display the image of contents on the content display area 111 of the display 100 and may display, on the bezel lighting area 113, the color displayed as the background of the control screen 1010 to light the bezel 200.

Figure 11A:
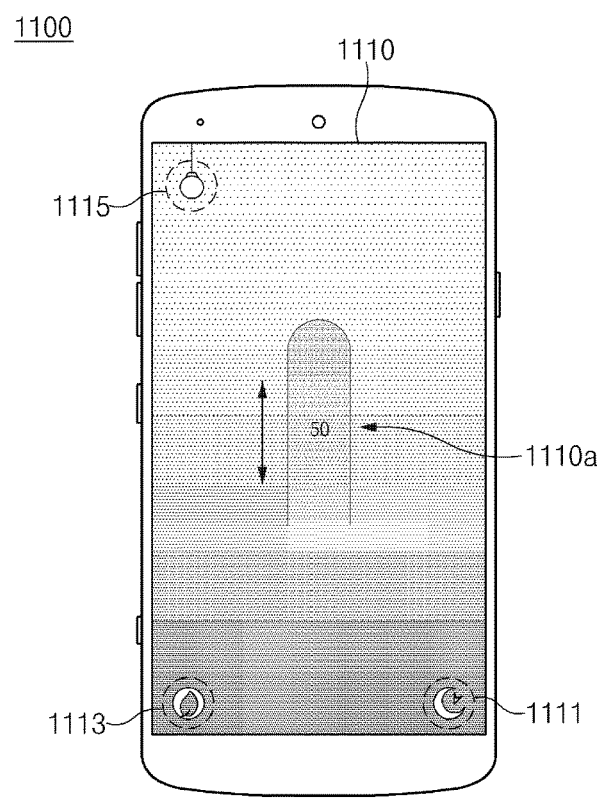
FIGS. 11A and 11B illustrate a bezel lighting function of a display device operating in conjunction with an electronic device, according to an embodiment of the present disclosure.
Figure 11B:
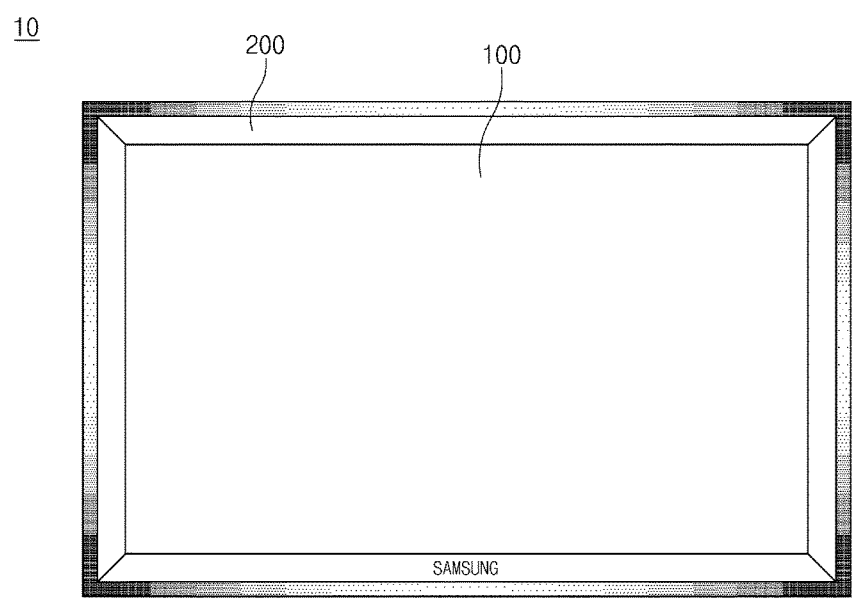

FIGS. 11A and 11B illustrate a bezel lighting function of a display device operating in conjunction with an electronic device, according to an embodiment of the present disclosure.

Referring to FIG. 11A, an electronic device 1100 may receive, from a user, an input (e.g., a touch on the bezel lighting icon 727 of FIG. 7B) for selecting a bezel lighting function and may execute the bezel lighting function.

According to an embodiment, the electronic device 1100 may receive, from the user, an instruction for displaying a selected image on only the bezel 200 of the display device 10. For example, when the bezel lighting function is executed, the electronic device 1100 may display, on a display thereof, a color display screen 1110 on which a color selected by the user is displayed as a background. According to an embodiment, the electronic device 1100 may receive, from the user, an input for controlling an image displayed through the bezel 200 of the display device 10. For example, the electronic device 1100 may receive, from the user, an input (see reference number 1110*a*) for controlling the brightness of the image displayed through the bezel 200 of the display device 10. The input (see reference number 1110a) for controlling the brightness of the image may be, for example, the user's drag in a vertical direction.

According to an embodiment, the electronic device 1100 may include icons for selecting a plurality of functions. For example, the electronic device 1110 may include a timer icon 1111, a sound icon 1113, and a content reproduction icon 1115 through which to select different functions.

Referring to FIG. 11B, if the display device 10 receives, from the electronic device 1100, an instruction for displaying an image on only the bezel 200, the display device 10 may light only the bezel 200 by using the selected image. For example, the display device 10 may display the selected image on only the bezel lighting area 113 of the display 100 to light only the bezel 200, and may display no image on the content display area 111.

According to an embodiment, through a timer function of the electronic device 1100, the display device 10 may light the bezel 200 for an input time period by using the selected image. For example, the display device 10 may display the selected image on the bezel lighting area 113 for the input time period.

According to an embodiment, through a sound function of the electronic device 1100, the display device 10 may output sound while displaying the selected image through the bezel 200. For example, the display device 10 may display the selected image on the bezel lighting area 113 and may output the input sound.

According to the various embodiments described above with reference to FIGS. 1 to 11B, the display device 10 may use light emitted from the display 100 to light the bezel 200, thereby using the bezel 200 as a design element and lighting for the display device 10. In addition, the display device 10 may display a status of the display device 10 through the bezel 200 to provide information about the status of the display device 10 to a user.

The term "module" used in this disclosure may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in computer-readable storage media in the form of a program module. The instruction, when executed by a processor (e.g., the processor 120), may cause the one or more processors to perform a function corresponding to the instruction. The computer-readable storage media, for example, may be the memory 130.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, a program instruction may include not only a mechanical code such as things generated by a compiler but also a high-level language code executable on a computer using an interpreter. The above hardware unit may be configured to operate via one or more software modules for performing an operation of various embodiments of the present disclosure, and vice versa.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A display device comprising:
   a display including an active area on which an image is displayed; and
   a bezel configured to cover edges of the display so that the bezel covers a part of the active area of the display,
   wherein the bezel includes:
      a transparent part configured to cover the part of the active area of the display and to internally transport light emitted from the covered part of the active area of the display by reflecting the light, emitted from the covered part of the active area of the display, inside the transparent part; and
      a reflection part including a reflection surface disposed parallel to one surface of the transparent part and configured to reflect light transmitted from the transparent part back into the transparent part,
   wherein the display device is configured to receive information about the image to be displayed on the display and about a specified period of time during which the image is to be displayed from an electronic device, and
   wherein the display is configured to display the image on the covered part of the active area of the display for the specified period of time based on the received information.

2. The display device of claim 1, wherein the transparent part includes a first surface disposed at one end of the transparent part and facing the covered part of the active area of the display so that the light emitted from the covered part of the active area of the display is transmitted into the transparent part through the first surface, and a second surface disposed at an other end of the transparent part so that the light transported internally through the transparent part is transmitted outside the transparent part through the second surface.

3. The display device of claim 2, wherein the transparent part further includes a third surface facing a different direction from the first surface and the second surface and,
   wherein the reflection surface of the reflection part is disposed parallel to the third surface and the reflection surface is configured to reflect the light transmitted from the transparent part through the third surface back into the transparent part.

4. The display device of claim 3, wherein the transparent part further includes a fourth surface facing the third surface, and wherein an angle between the fourth surface and the active area of the display is greater than or equal to 90° and less than 180°.

5. The display device of claim 1, wherein the display further includes
a non-active area on which no image is displayed, and
wherein the reflection part is disposed to cover the non-active area.

6. The display device of claim 1, wherein the transparent part is formed of any one of polymethyl methacrylate (PMMA), polycarbonate (PC), and polyethylene terephthalate (PET).

7. The display device of claim 1, wherein a high-reflectivity material is coated on the reflection surface of the reflection part that faces the transparent part or a reflective sheet is attached to the reflection surface of the reflection part that faces the transparent part.

8. The display device of claim 1, wherein at least one of the transparent part and the reflection part includes a pattern, and
wherein the pattern is configured to change a path of the light transported to the transparent part so that the light transported to the pattern is transmitted outside the transparent part from a position of the pattern through a surface opposite to the one surface of the transparent part.

9. The display device of claim 8, wherein the pattern is formed on a surface where the transparent part and the reflection part face each other.

10. The display device of claim 8, wherein the pattern formed on the transparent part is a recessed pattern, and
wherein the pattern formed on the reflection part is an embossed or recessed pattern.

11. The display device of claim 8, wherein the pattern formed on the reflection part is a recessed pattern, and
wherein the pattern formed on the transparent part is an embossed or recessed pattern.

12. The display device of claim 1, wherein the covered part of the active area of the display is controlled independently of the part not covered by the transparent part of the active area.

13. The display device of claim 12, wherein the display is configured to display the image on only the covered part of the active area of the display in a standby state.

14. A method of controlling a display device, the method comprising:
receiving information about an image from an electronic device operating in conjunction with the display device;
displaying the image on a part of display areas of a display of the display device that is covered by a transparent part of a bezel based on the received information about the image; and
lighting the bezel by using light emitted from the covered part of the display areas on which the image is displayed,
wherein the received information about the image includes information about the image to be displayed on the display and information about a specified period of time during which the image is to be displayed, and
wherein the displaying of the image includes displaying the image on the covered part of the display areas for the specified period of time based on the received information about the image.

15. The method of claim 14, wherein the information about the image includes information about a color selected through the electronic device, and
wherein the displaying of the image on the display includes
displaying the image including the selected color on the covered part of the display areas.

16. The method of claim 14, wherein the displaying of the image on the display includes
displaying the image on the covered part of the display areas and a display area of the display areas that is not covered by the transparent part of the bezel based on the received information about the image.

17. The method of claim 14, wherein the displaying of the image on the display includes
displaying the image on the covered part of the display areas based on the received information about the image and not displaying the image on a display area of the display areas that is not covered by the transparent part of the bezel.

18. The method of claim 14, wherein the information about the image includes information about the image to be displayed on the display and information about sound output when the image is displayed, and
wherein the displaying of the image on the display includes
displaying the image on the covered part of the display areas and outputting sound.

19. A non-transitory computer-readable recording medium in which a program for performing a method is recorded, the method comprising:
receiving information about an image from an electronic device operating in conjunction with a display device;
displaying the image on a part of display areas of a display of the display device that is covered by a transparent part of a bezel based on the received information about the image; and
lighting the bezel by using light emitted from the covered part of the display areas on which the image is displayed,
wherein the received information about the image includes information about the image to be displayed on the display and information about a specified period of time during which the image is to be displayed, and
wherein the displaying of the image on the part of display areas of the display includes displaying the image on the covered part of the display areas for the specified period of time based on the received information about the image.

* * * * *